United States Patent [19]
Taira

[11] Patent Number: 5,270,544
[45] Date of Patent: Dec. 14, 1993

[54] ENERGY-DISPERSIVE X-RAY DETECTOR
[75] Inventor: Masayuki Taira, Tokyo, Japan
[73] Assignee: Jeol Ltd., Tokyo, Japan
[21] Appl. No.: 907,722
[22] Filed: Jul. 2, 1992
[30] Foreign Application Priority Data Jul. 5, 1991 [JP] Japan .................. 3-165690

[51] Int. Cl.5 ................... H01J 37/244; H01J 37/26
[52] U.S. Cl. ..................... 250/310; 250/370.15; 250/399
[58] Field of Search ............... 250/310, 399; 250/370.15

[56] References Cited

U.S. PATENT DOCUMENTS

| 3,812,288 | 5/1974 | Walsh et al. | 250/399 |
| 4,851,684 | 7/1989 | Martin et al. | 250/352 |
| 4,910,399 | 3/1990 | Taira et al. | 250/310 |

FOREIGN PATENT DOCUMENTS 63-60263  4/1988  Japan.

Primary Examiner—Bruce C. Anderson
Attorney, Agent, or Firm—Webb, Burden, Ziesenheim & Webb

[57] ABSTRACT

An X-ray detector used in an energy-dispersive X-ray spectrometer The detector comprises a cooling vessel containing liquid nitrogen and a protective container enclosing the cooling vessel. The space between the cooling vessel and the protective container is hermetically partitioned into a dewar tank portion and a nose portion by a partition wall. An X-ray detector device is accommodated in the nose portion. If the liquid nitrogen inside the cooling vessel evaporates, the produced gas stays only inside the dewar tank portion and does not enter the nose portion.

2 Claims, 2 Drawing Sheets

ENERGY-DISPERSIVE X-RAY DETECTOR

FIELD OF THE INVENTION

The present invention relates to an X-ray detector used in an energy-dispersive X-ray spectrometer.

BACKGROUND OF THE INVENTION

X-ray detectors used in energy-dispersive X-ray spectrometers are classified into two categories: (1) window type comprising a semiconductor device for X-ray detection and a window having a thin film of beryllium in front of the device; and (2) windowless type not having a thin film in front of a semiconductor device for X-ray detection. The former type uses the thin window to prevent adhesion of frost or gas to the surface of the X-ray detector, thereby protecting the detector against contamination. The latter type employs a shutter valve for the same purpose. The inside of a protective container which hermetically seals the X-ray detector is cooled by liquid nitrogen and maintained as high vacuum. However, if the liquid nitrogen becomes depleted, the temperature inside the protective container rises, resulting in a liberation of gas from the low temperature cryogenic absorber. This deteriorates the degree of vacuum inside the protective container. When cooled again by liquid nitrogen, the X-ray detector is contaminated by the liberated gas, deteriorating the performance. Normally, an adsorbent is placed inside the protective container to maintain the inside of the container as high vacuum. If the energy-dispersive spectrometer is used for a long time, the capability of the adsorbent to adsorb gas degrades gradually, thus deteriorating the degree of vacuum. As a result, frost or gas adheres to the surface of the detector. Under this condition, low-energy X-rays produced from light elements are absorbed. Hence, the sensitivity of light element measurement deteriorates. In the case of an energy-dispersive X-ray spectrometer making use of Peltier-effect cooling without using liquid nitrogen, it is necessary to maintain an ion pump in operation, for absorbing produced gas, even if the power supply is switched off.

An improved X-ray detector has already been proposed in Japanese Utility Model Application Laid-Open No. 60263/1988. This detector which can be either of the window type or of the windowless type is capable of preventing adhesion of contaminating matter such as frost and gas to the detector due to a drop in the degree of vacuum inside the protective container. The construction of this detector is shown in FIGS. 4 and 5.

FIG. 4 schematically shows the construction of an energy-dispersive X-ray spectrometer using a window type X-ray detector. Liquid nitrogen 2 is contained in a cooling vessel 1. A rod 3 serves to conduct heat. An X-ray detector device is indicated by 4. The cooling vessel 1, the rod 3, and the X-ray detector device 4 are hermetically sealed in a protective container 5. This container 5 is tubular at one end to permit the detector device 4 to be placed near a sample 7 that is positioned inside a vacuum vessel or vacuum envelope 6 such as an electron microscope. A cryogenic adsorbent 8 such as active carbon is disposed on the outer periphery of the cooling vessel 1 to keep a good vacuum inside the space A between the cooling vessel 1 and the protective container 5. The space A is evacuated to approximately $10^{31\ 5}$ torr so that the low temperature of the cooling vessel is not conducted to the protective container 5. A window 9 having a taut thin film of beryllium, for example, is held at one end of the protective container 5 and enables hermetic sealing of the vacuum vessel 6. The output signal from the X-ray detector device 4 can be taken through an output terminal 10. An exhaust port 11 that can be opened and closed allows the space A between the cooling vessel 1 and the protective container 5 to be evacuated. The cooling vessel 1 is provided with a top hole which is closed by a cap 12. The liquid nitrogen 2 can be inserted and Withdrawn through this hole. The sample 7 is irradiated with an electron beam 13 produced by an electron gun 20, so that the irradiated portion of the sample 7 emits characteristic X-rays 14. These characteristic X-rays 14 pass through the window 9 and are detected by the X-ray detector device 4, where they are converted into an electrical signal.

The protective container 5 is connected with the vacuum vessel 6 via an exhaust pipe 16, a vacuum valve 17, and another exhaust pipe 18. A vacuum gauge 19 measures the degree of vacuum inside the space A. The inside of the vacuum vessel 6 is evacuated by a vacuum pump 21.

In this apparatus, if a drop in the degree of vacuum in the space A is detected by the vacuum gauge 19, or if the amount of the liquid nitrogen 2 consumed per unit time inside the cooling vessel 1 increases due to such a drop in the degree of vacuum in the space A, the vacuum valve 17 is opened, and the space A is evacuated by the vacuum pump 21. If the degree of vacuum in the space A is improved, the vacuum valve 17 is closed. If water vapor is deposited as frost on the surface of the X-ray detector device 4, the liquid nitrogen 2 is taken out of the cooling vessel 1 and heated to room temperature. Then, the vacuum valve 17 is opened. The space A is sufficiently evacuated by the pump 21 to remove the frost adhering to the surface of the detector device 4. Thereafter, the vacuum valve 17 is closed, and liquid nitrogen is again injected into the vessel 1. In this way, if the X-ray detector device 4 is contaminated, it can be easily regenerated and used.

FIG. 5 schematically shows an energy-dispersive X-ray spectrometer using a windowless X-ray detector. A gate valve 15 is mounted ahead of an X-ray detector device 4. When X-ray analysis is not performed, the valve 15 is closed to maintain the vacuum inside the space A between a cooling vessel 1 and a protective container 5. When X-ray analysis is performed, the valve 15 is opened to permit characteristic X-rays from a sample 7 to directly impinge on the detector device 4.

In this apparatus, if a drop in the degree of vacuum in the space A is confirmed, the gate valve 15 is closed. In the same way as the above-described window type energy-dispersive X-ray spectrometer, the vacuum valve 17 is opened, and the space is evacuated by the vacuum pump 21. After an improvement in the degree of vacuum in the space A is confirmed through the use of the vacuum gauge 19, the vacuum valve 17 is closed. The gate valve 15 is opened, and then the apparatus is used. In this structure, the degree of vacuum inside the vacuum vessel 6 is not decreased. In addition, contamination of the X-ray detector device 4 can be prevented, because the gas staying in the space A is evacuated through the exhaust pipe 16.

Where the space A between the cooling vessel 1 and the protective container 5 is designed to be evacuated by the pumping system for other apparatus as described above, if the cooling vessel 1 has a relatively small volume, e.g., about 1 liter, the volume of the space A is small, whether the used X-ray detector is of the window type or windowless type. Therefore, the space A can be evacuated to a high vacuum in a short time. However, where the volume of the cooling vessel 1 is relatively large, e.g., about 10 liters, a very large amount of gas is produced at room temperature. In this case, it takes a long time to evacuate the space A to such an extent that the operation of the X-ray detector device 4 is not hindered. Furthermore, a great burden is imposed on the pumping system which evacuates the space A.

SUMMARY OF THE INVENTION

It is an object of the present invention to provide an energy-dispersive X-ray detector capable of being maintained in sufficiently high vacuum condition if gas is produced in the space between a cooling vessel and a protective container, irrespective of the volume of the cooling vessel.

Most of the gas produced in the space between the cooling vessel and the protective container arises from the cooling vessel having a large surface area and also from the adsorbent. The amount of gas produced from around the X-ray detector device is quite small. It can be seen, therefore, that the space accommodating the detector device can be maintained at a good vacuum by hermetically isolating only a portion of the X-ray detector which is close to the detector device and exists within the space between the cooling vessel and the protective container even if the degree of vacuum in the remaining portion drops. In this way, the inventive energy-dispersive X-ray detector is characterized in that a partition wall is provided which hermetically divides the space between the cooling vessel and the protective container into a dewar tank portion and a nose portion accommodating the detector device. If liquid nitrogen contained in the cooling vessel evaporates to thereby empty the vessel, thus deteriorating the degree of vacuum inside the dewar tank portion, the nose portion is maintained as good vacuum. If gas is produced inside the nose portion, the space in the nose portion can be evacuated in a short time by an external pumping system, because the space is very small. Consequently, the nose portion can be maintained as high vacuum.

Other objects and features of the invention will appear in the course of the description thereof which follows.

DETAILED DESCRIPTION OF THE INVENTION

Figure 1:
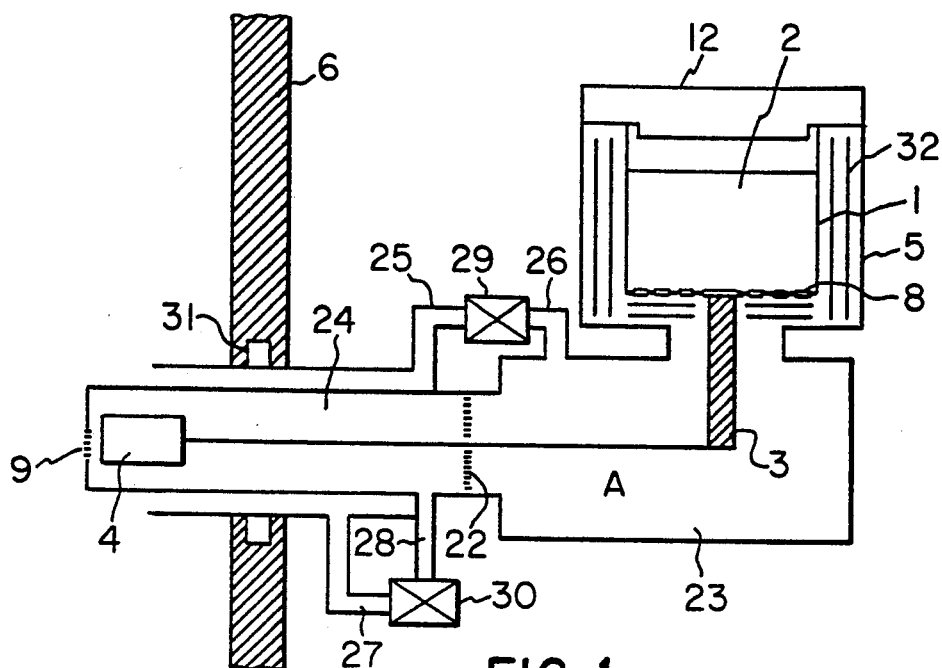
FIG. 1 is a schematic view of an energy-dispersive X-ray detector according to the invention.

Referring to FIG. 1, there is shown an energy-dispersive X-ray spectrometer according to the invention. This spectrometer comprises a partition wall 22, a dewar tank portion 23, a nose portion 24 accommodating an X-ray detector device 4, exhaust pipes 25, 26, 27, 28, vacuum valves 29, 30, a vacuum seal 31, and a heat insulator 32. It is to be noted that like components are indicated by like reference numerals in various figures.

The partition wall 22 is disposed at a given position in the space A between the cooling vessel 1 and the protective container 5 to form the dewar tank portion 23 and the nose portion 24. The dewar tank portion 23 and the nose portion 24 are hermetically isolated from each other. The dewar tank portion 23 is connected with the vacuum vessel 6 via the exhaust pipe 26, the vacuum valve 29, and the exhaust pipe 25. The nose portion 24 is connected with the vacuum vessel 6 via the exhaust pipe 28, the vacuum valve 30, and the exhaust pipe 27. The exhaust pipes 25 and 27 are formed coaxially around the outer periphery of the nose portion 24. When the detector device is moved relative to the vacuum vessel 6, the exhaust pipes 25 and 27 move with the nose portion 24.

Figure 2A:
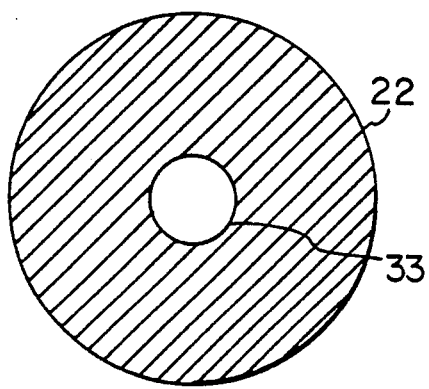
FIG. 2a is a plan view of the partition wall of the detector shown in FIG. 1.
Figure 2B:
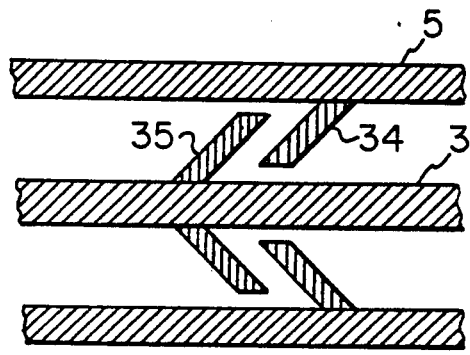
FIG. 2b is a cross-sectional view of other partition walls.

The partition wall 22 can take the form of a disklike member having an opening 33 through which a heat-conducting rod 3 extends, as shown in FIG. 2a. Alternatively, as shown in FIG. 2b, a truncated conical member 34 is disposed on the inner wall of the protective container 5, and a conical member 35 is disposed around the heat-conducting rod 3. These conical members 34 and 35 are disposed adjacently to form the partition wall having the opening. Preferably, the partition wall 22 may be made of a thin film of a fiber-reinforced plastic, Mylar, parylene, polystyrene, or other material which maintains vacuum well, has heat insulation, and produces no gas.

In the structure shown in FIG. 1, if gas is produced inside the space A because of a drop in the capability of the adsorbent 8 to adsorb gas or because the cooling vessel 1 is emptied of the liquid nitrogen 2, the gas stays only inside the dewar tank portion 23 and does not enter the nose portion 24. Consequently, the inside of the nose portion 24 is maintained as good vacuum. As a result, the X-ray detector device 4 is prevented from being contaminated with gas or frost. If gas should be generated inside the nose portion 24 and the degree of vacuum drop, then vacuum valve 30 will be opened. Under this condition, the inside of the nose portion can be evacuated by the pumping system (not shown) beginning with the exhaust pipe 27 and ending with the vacuum vessel 6. Since the space inside the nose portion 24 is very small, it can be quickly evacuated. Moreover, the load on the pumping system for the vacuum vessel 6 can be reduced greatly compared with the prior art apparatus. Obviously, the vacuum valve 30 can be kept open during the operation of the energy-dispersive X-ray spectrometer.

With respect to the evacuation of the dewar tank portion 23, if the volume of the dewar tank portion 23 is small and this portion can be evacuated in a short time, i.e., the load on the pumping system for the vacuum vessel 6 is small, then analysis can be made while evacuating the tank portion by maintaining the vacuum valve 29 open throughout the operation of the spectrometer. On the other hand, if the volume of the dewar tank portion 23 is large and it takes a long time to evacuate the inside, i.e., the load on the pumping system for the vacuum vessel 6 is large, then the evacuation may be effected while opening the vacuum valve 29 when the energy-dispersive X-ray spectrometer is not in use.

Figure 3:
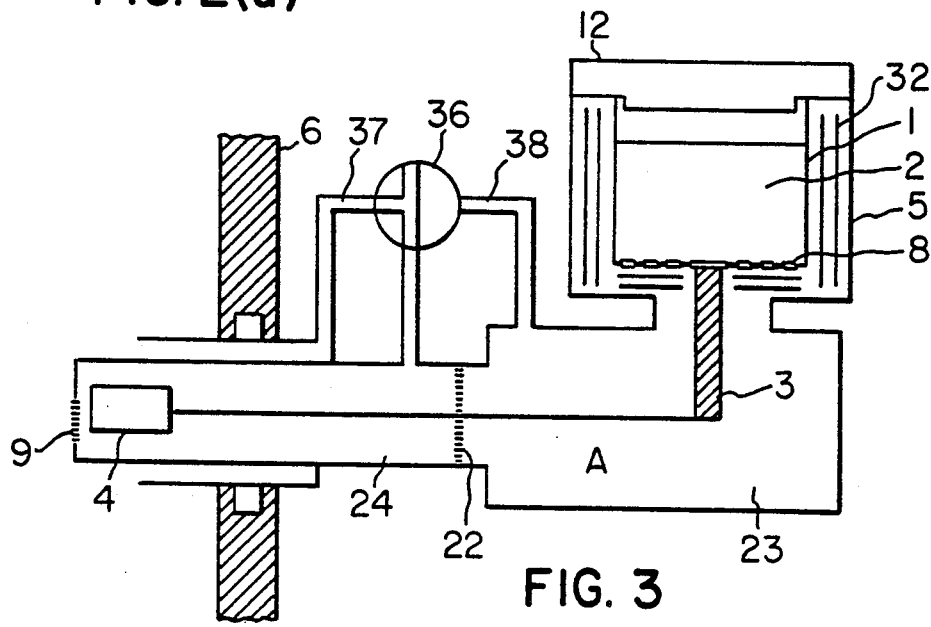
FIG. 3 is a schematic view of another energy-dispersive X-ray detector according to the invention.
Figure 4:
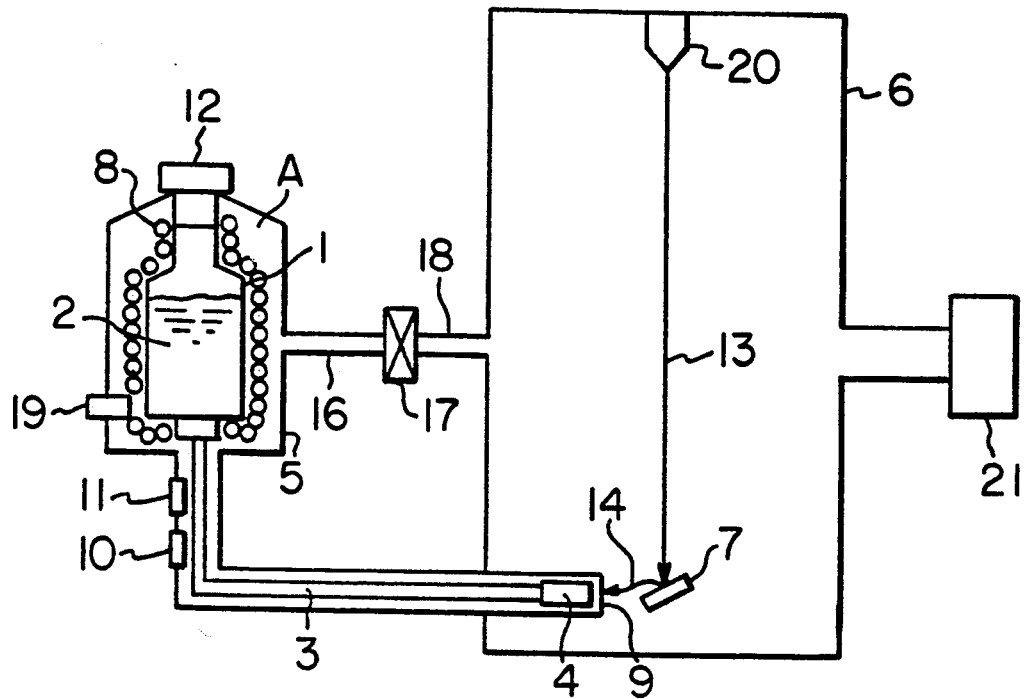
FIG. 4 is a schematic view of a conventional energy-dispersive X-ray spectrometer using a window type X-ray detector.
Figure 5:
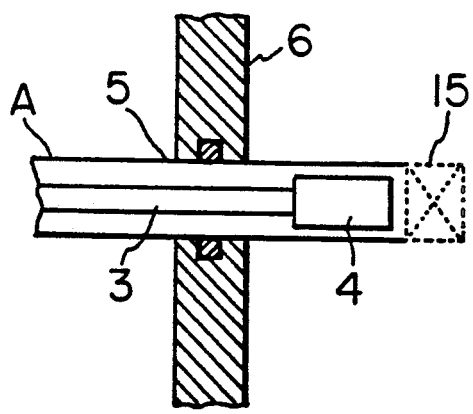
FIG. 5 is a schematic cross-sectional view of a conventional windowless X-ray detector.

Referring next to FIG. 3, there is shown another energy-dispersive X-ray detector according to the invention. In the apparatus of FIG. 1, the dewar tank portion 23 and the nose portion 24 are equipped with the irrespective pumping systems. In the apparatus shown in FIG. 3, the dewar tank portion 23 and the nose portion 24 have a common pumping system. The apparatus of FIG. 3 is similar to the apparatus of FIG. 1 in other respects. More specifically, in FIG. 3, the nose portion 24 is connected with an exhaust pipe 37 via a three-way valve 36. The dewar tank portion 23 is connected with the exhaust pipe 37 via an exhaust pipe 38 and via the three-way valve 36. The condition of the three-way valve 36 is switched as the need arises to evacuate either the nose portion 24 or the dewar tank portion 23.

The three-way valve 36 shown in FIG. 3 can evacuate only one of the dewar tank portion 23 and the nose portion 24 at a time. A valve which, when it is open, permits the dewar tank portion 23 and nose portion 24 to be evacuated simultaneously may also be employed.

While the preferred embodiments of the invention have been described, it is to be understood that the present invention is not limited to the above embodiments and that various changes and modifications are possible. In the above embodiments, a window type X-ray detector is used. Of course, the invention can also be applied to a windowless X-ray detector. Also, the nose portion 24 may be coated with an adsorbent. In a further example, a vacuum gauge is disposed either in the dewar tank portion 23 or in the nose portion 24, and evacuation is carried out automatically when the degree of vacuum drops below a given value.

As described thus far, in accordance with the present invention, if gas is produced in the space between the cooling vessel and the protective container, flow of the gas into the nose portion is prevented; otherwise the detector device would be contaminated. Also, the space in the nose portion is small and so the evacuation can be completed in a short time. Hence, the load on the external pumping system can be alleviated. In addition, the detector device can be kept at a low temperature for a long time, because the cooling vessel can be made large in size. Therefore, the operation time can be increased. Further, the dewar tank portion does not require any strict degree of vacuum. Even if the degree of vacuum deteriorates, the detector device is affected only a little. In consequence, the intervals of time at which the detector is evacuated can be increased.

Having thus described our invention with the detail and particularity required by the Patent Laws, what is claimed to be protected by Letters Patent is set forth in the following claims.

What is claimed is:

1. In an energy-dispersive x-ray spectrometer comprising a vacuum tight column for enclosing an electron gun, electron beam focusing and directing system, there being associated with said column an evacuation system for evacuating the column, a detector comprising:
   an x-ray sensor device,
   means for positioning the x-ray sensor device near the specimen within the column,
   a container for coolant,
   heat conductive means extending between the container for coolant and the x-ray sensor device,
   a hermetic enclosure which encloses the x-ray sensor device, a portion of the container for coolant and the conductive means,
   a partition wall that hermetically divides the volume of the hermetic enclosure into a tank portion surrounding a part of the container for coolant and a nose portion that surrounds the x-ray sensor,
   a first valve means for controlling communication between the nose portion of the hermetic enclosure and the vacuum tight column, and
   a second valve means for controlling communication between the tank portion of the hermetic enclosure and the vacuum tight column.

2. The detector according to claim 1 wherein the first valve means and the second valve means have a common valve base.

* * * * *